US012620948B2

(12) United States Patent
Lloyd

(10) Patent No.: US 12,620,948 B2
(45) Date of Patent: May 5, 2026

(54) RF AMPLIFIER CIRCUIT ARRANGEMENT AND ELECTRONIC DEVICE

(71) Applicant: Rohde & Schwarz GmbH & Co. KG, Munich (DE)

(72) Inventor: Paul Lloyd, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 466 days.

(21) Appl. No.: 18/300,723

(22) Filed: Apr. 14, 2023

(65) Prior Publication Data

US 2023/0370028 A1    Nov. 16, 2023

Related U.S. Application Data

(60) Provisional application No. 63/341,016, filed on May 12, 2022.

(51) Int. Cl.
| | |
|---|---|
| *H03F 3/24* | (2006.01) |
| *H03F 1/02* | (2006.01) |
| *H03F 1/56* | (2006.01) |
| *H03F 3/60* | (2006.01) |

(52) U.S. Cl.
CPC ........... *H03F 3/245* (2013.01); *H03F 1/0288* (2013.01); *H03F 1/565* (2013.01); *H03F 3/604* (2013.01); *H03F 2200/198* (2013.01); *H03F 2200/451* (2013.01)

(58) Field of Classification Search
CPC ........ H03F 3/245; H03F 1/0288; H03F 1/565; H03F 3/604; H03F 2200/198; H03F 2200/451
USPC ....................................................... 330/291
See application file for complete search history.

(56) References Cited

U.S. PATENT DOCUMENTS

| | | | | |
|---|---|---|---|---|
| 4,025,924 | A | * | 5/1977 | Luedtke .................... G01S 3/14 |
| | | | | 342/419 |
| 4,656,434 | A | | 4/1987 | Selin |
| 6,297,696 | B1 | | 10/2001 | Abdollahian et al. |
| 6,394,362 | B1 | | 5/2002 | Kramr |
| 8,957,734 | B2 | * | 2/2015 | Ahmed ................... H03F 3/211 |
| | | | | 330/124 R |

(Continued)

FOREIGN PATENT DOCUMENTS

| | | |
|---|---|---|
| EP | 1609239 B1 | 7/2010 |
| GB | 2533824 A | 7/2016 |

OTHER PUBLICATIONS

Cao et al., "Load Modulated Balanced Amplifier with Reconfigurable Phase Control for Extended Dynamic Range", 2019 IEEE/MTT-S International Microwave Symposium. (Year: 2019).*

(Continued)

*Primary Examiner* — Hafizur Rahman
(74) *Attorney, Agent, or Firm* — Westman, Champlin & Koehler, P.A.

(57) ABSTRACT

The present invention relates to a RF amplifier circuit arrangement for amplifying at least one RF input signal to an output signal for delivery to a load. The RF amplifier circuit arrangement uses a simple and low-cost RF clipping circuit within a load modulated balanced amplifier arrangement which passes RF input signals to output linearly up to the signal input reaches a predefined amplitude. Beyond that predefined amplitude the clipping circuit clips excess amplitudes. The present invention further relates to an electronic device.

20 Claims, 11 Drawing Sheets

(56) References Cited

U.S. PATENT DOCUMENTS

| | | | |
|---|---|---|---|
| 10,749,478 B2 | 8/2020 | Hou et al. | |
| 2005/0134377 A1 | 6/2005 | Dent | |
| 2011/0095827 A1* | 4/2011 | Tanaka | H03F 3/245 |
| | | | 330/279 |
| 2013/0093509 A1* | 4/2013 | Cabrera | H03F 3/211 |
| | | | 330/53 |
| 2015/0028945 A1* | 1/2015 | Gaynor | H03F 3/189 |
| | | | 330/107 |
| 2015/0145602 A1* | 5/2015 | Felgentreff | H03F 1/56 |
| | | | 330/295 |
| 2016/0056776 A1* | 2/2016 | Fröhlich | H03F 3/45475 |
| | | | 330/291 |
| 2019/0158030 A1* | 5/2019 | Hou | H03F 1/0288 |
| 2024/0283406 A1* | 8/2024 | Hou | H03F 1/0288 |

OTHER PUBLICATIONS

Diode Clipping Circuit, https://www.eeeguide.com/shunt-clipping-circuits/ (Year: 2020).*

U.S. Appl. No. 18/303,781, filed Apr. 20, 2023, entitled "Amplifier circuit arrangement and electronic device", 34 pages.

Website Article, "Diode Clipping Circuits", Retrieved from the Internet: https://www.electronics-tutorials.ws/diode/diode-clipping-circuits.html, n.d., 5 pages.

Quaglia, R. et al., "Load-Modulated Balanced Amplifier", IEEE microwave magazine, Dec. 2022, 11 pages.

Collins D., et al., "The Orthogonal LMBA: A Novel RFPA Architecture With Broadband Reconfigurability", IEEE Microwave and Wireless Components Letters, vol. 30, No. 9, Sep. 2020, 4 pages.

Notice of Allowances for U.S. Appl. No. 18/300,723, dated Aug. 26, 2025 and Oct. 21, 2025, 22 pages.

* cited by examiner

30
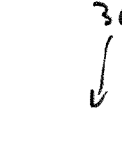
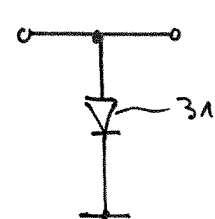
FIG. 3A
30
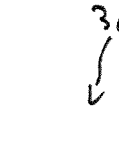
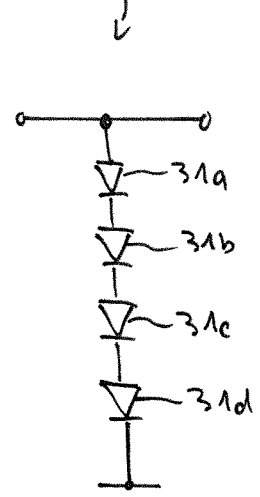
FIG. 3B
30
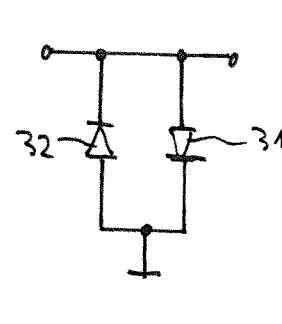
FIG. 3C
30
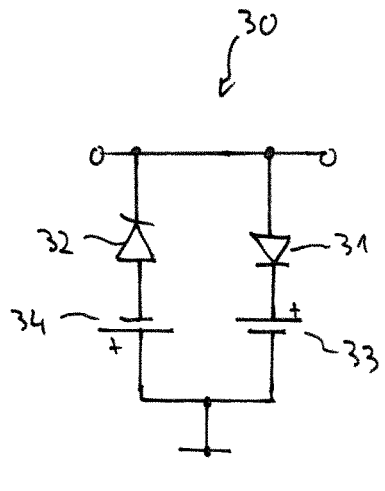
FIG. 3D
30
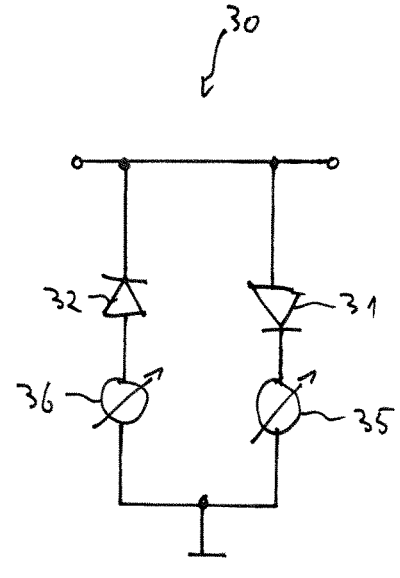
FIG. 3E

RF AMPLIFIER CIRCUIT ARRANGEMENT AND ELECTRONIC DEVICE

CROSS-REFERENCE TO RELATED APPLICATION

This application claims the benefit of U.S. provisional application No. 63/341,016, filed on May 12, 2022, the content of which is hereby incorporated by reference in its entirety.

TECHNICAL FIELD

The present invention relates to a RF amplifier circuit arrangement for amplifying at least one RF input signal to an output signal for delivery to a load. The present invention further relates to an electronic device.

BACKGROUND OF THE INVENTION

RF amplifiers are utilized for a variety of applications, such as in wireless communications systems. As a result, the RF amplifiers must be able to handle the power requirements associated with such wireless communications systems.

A RF power amplifier is a unit that strengthens the RF signal to combat losses in transmission by converting DC electric power to the added RF output power. With the rapid development of wireless communications, the design and development of high-efficiency power amplifier design has become one of the most prevalent topics, in particular due to the fact that the RF power amplifier consumes a high portion of the transmitter energy and thus its power efficiency directly impacts the performance of the wireless communications system. In addition, as a power amplifier is the main source of distortion generated by the transmitter, linearity is another concern in the design of power amplifiers, particularly in wideband systems. Modulated signals with high peak to average power ratio (PAPR) are commonly used in modern wireless communications systems to improve spectral efficiency, creating a strong demand for power amplifiers to have high efficiency performance not only at peak power.

Many power amplifier architectures have been introduced that are configured to envelope the tracking and outphasing. Among them, the commonly known Doherty power amplifier has become one of the most widely used power amplifier architecture in cellular communication systems, particularly in high power base-stations. However, with further increase of bandwidth, Doherty power amplifier design becomes difficult.

Another modern RF amplifier architecture is the so-called load modulated balanced amplifier—or shortly LMBA, which was initially described in US 2005 0134377 A1. In the LMBA architecture described in US 2005 0134377 A1, the RF input signal is equally split via a quadrature splitter between a first and a second amplifier. The outputs of the two amplifiers are then connected to the two input ports of a quadrature coupler. An additional auxiliary drive signal, amplified by an auxiliary amplifier, is injected to an auxiliary or isolated port of the coupler. The load is connected to an output port of the quadrature coupler. Due to the functional property of the quadrature splitter, there is a 90° phase difference between the signal input to the first and second amplifiers. The quadrature coupler behaves in exactly the same manner as the splitter, which also introduces a 90° phase difference between the input signals. Therefore, the signals from the two primary amplifiers arrive at the load with the same phase and add constructively, while the signals arrive at the auxiliary or silent port with 180° out of phase and thus add destructively LMBAs show a similar behavior than Doherty amplifiers, but LMBAs have a wider bandwidth which makes them suitable for a wider range of applications. However, a LMBA has several more or less independent parameters wherein each of these parameters needs to be optimized to achieve maximum performance. One of these parameters is the phase shift and there is the need to provide an exact phase shift for the signals provided to the amplifiers in order to guarantee a proper operation of the LMBA. Present solutions employ multiple baseband inputs or digitally controlled precision level inputs where both of these solutions are comparatively complex and thus expensive.

Against this background, there is the need to provide an easier and in particular cheaper RF amplifier arrangement.

SUMMARY OF THE INVENTION

The present invention provides an RF amplifier circuit arrangement and an electronic device having the features of the independent claims.

According to a first aspect, a RF amplifier circuit arrangement for amplifying at least one radio frequency (RF) input signal is provided, wherein the RF amplifier circuit arrangement comprising: an RF signal splitting circuit configured to split a RF input signal into a first RF input signal and a second RF input signal; an RF signal clipping circuit configured and arranged such to receive the first RF input signal and to produce a clipped RF input signal thereof; and a load modulated amplifier coupled to the signal splitting device and the amplitude limiting device, the load modulated amplifier comprising a first quadrature hybrid coupler at an input side of the load modulated amplifier wherein the first quadrature hybrid coupler is arranged such to receive directly the clipped input signal and the second input signal.

According to a second aspect, an electronic device comprising a RF amplifier circuit arrangement for amplifying at least one radio frequency (RF) input signal, wherein the RF amplifier circuit arrangement comprising: an RF signal splitting circuit configured to split a RF input signal into a first RF input signal and a second RF input signal; an RF signal clipping circuit configured and arranged such to receive the first RF input signal and to produce a clipped RF input signal thereof; and a LMBA coupled to the signal splitting device and the amplitude limiting device, the LMBA comprising a first quadrature hybrid coupler at an input side of the LMBA wherein the first quadrature hybrid coupler is arranged such to receive directly the clipped input signal and the second input signal.

The present invention is based on the idea to use a simple and low-cost RF hardclipper circuit within a load modulated balanced amplifier arrangement. This clipping circuit passes RF input signals to output linearly up to the signal input reaches a predefined amplitude. Beyond this predefined amplitude the clipping circuit clips excess amplitudes. Below the predefined amplitude the clipping circuit is more or less transparent for the RF input signal.

The quadrature hybrid coupler which is arranged downstream uses the splitted RF input signals whereas one of the splitted RF input signals is clipped to a predetermined clipping levels provided by the clipping circuit. The 3-dB quadrature hybrid coupler is performing an analog Fourier transformation which means that a phase difference between the two input signals of the hybrid coupler is transformed in an amplitude difference at the output side and vice versa. However, when there is no amplitude difference on the two input terminals of the quadrature hybrid coupler, there is no phase difference in the outputs either. As such, in case of an amplitude difference on the two input terminals for example due to the incipient clipping effect, the 3-dB quadrature hybrid coupler performs a more or less 90° phase shift on one of its output ports. This way, a very simple and low cost solution for the selective operation of the amplifiers of the load modulated balanced amplifiers is provided which in addition is provided by a purely analog implementation.

Advantageous configurations and developments emerge from the further dependent claims and from the description with reference to the figures of the drawings.

According to a further aspect, the RF signal splitting circuit is a passive RF signal splitting circuit configured to split the RF input signal into two identical first and second RF input signals. Such a passive RF signal splitting circuit does not comprise any active components so that it produces at its output splitted first and second RF input signals that are preferably linear and if possible identical, except for some slight phase and amplitude variations.

According to a not compulsory, but preferable aspect, the RF signal splitting circuit is a symmetrical power divider which is configured to split as well the positive and negative signal components of the RF input signal.

In a preferable configuration, the RF signal splitting circuit comprises a symmetrical Wilkinson power divider and in particular a 3-way Wilkinson splitter. In the field of RF or microwave technology, a Wilkinson power divider stands for a specific type of power divider circuits that can achieve isolation between the output ports while maintaining a matched condition on all ports.

According to a further aspect, the RF signal clipping circuit comprises a diode limiter circuit comprising at least one diode. The diode may be a conventional signal diode, a Zener diode or the like. This kind of diode provides a clipping level for the RF input signal at an amplitude of about 0.7 Volt. According to some further embodiments, by employing a biased diode it is possible to provide a higher clipping level for the RF input signal. Additionally or alternatively, it is also possible to provide a plurality of diodes that are connected in series to each other in order to provide higher clipping levels.

According to a further configuration, the diode limiter circuit comprises at least two diodes which are connected antiparallel to each other. This way, a 2-level clipping for the positive and the negative signal portion may be provided.

According to a still further embodiment of the RF signal clipping circuit, the RF signal clipping circuit is configured such to set a predefined clipping level. This way, the clipping level that is used to produce the clipped RF input signal is adjustable, variable and preferably programmable depending on the needs or a user-definition. Setting, varying or adjusting a predefined clipping level may be done by means of a settable diode, e.g. by providing a settable bias voltage to the diode. Additionally or alternatively, setting the predefined clipping level may be done by means of a suitable switchable diode network.

According to a further aspect, the LMBA is an orthogonal load modulated balanced amplifier (OLMBA). Compared to the LMBA, the OLMBA displays many of the same benefits, such as active adaptive tuning using the phase and amplitude of an external control signal, but with much lower power requirements on the control signal power. As such, a useful range of active tuning can be implemented with essentially no impact on overall efficiency due to the low level of a control signal.

According to a further aspect, the first quadrature hybrid coupler comprises a first input port and a reverse input port. The first quadrature hybrid coupler is arranged such to receive the clipped RF input signal at its reverse input port. This way, a simple clipping circuit based on low-cost diodes that is connected with the reverse port of the first quadrature hybrid coupler on the input side of the LMBA or OLMBA allows selective control of the amplifiers of the LMBA or OLMBA, respectively.

According to a further aspect, the LMBA further comprises a second quadrature hybrid coupler at an output side of the LMBA. The LMBA further comprises a main amplifier (such as a carrier amplifier) and an auxiliary amplifier (such as a peaking amplifier) that are arranged between the first and second quadrature hybrid coupler, respectively. The first and second quadrature hybrid couplers are preferably identical.

In an additional configuration, the LMBA further comprises a negative resistance amplifier circuit. The negative resistance amplifier circuit is coupled to a third port (e.g. the isolated port) of the second quadrature hybrid coupler and is having a reflection coefficient greater than or equal to 1. The negative resistance amplifier circuit comprises a first and a second terminal, wherein the first terminal acts as well as input and output terminal of the negative resistance amplifier circuit and wherein the second terminal is coupled to a reference voltage.

In one specific configuration, at least one of the auxiliary amplifiers of the LMBA and the negative resistance amplifier circuit are selectively operable to operate in combination with the main amplifier of the LMBA.

According to a further aspect of this disclosure, by using a negative resistance amplifier which uses the signal already provided at the third port of the second quadrature hybrid coupler as an input signal and which reflects this signal or an amplified signal derived from this signal back to the same third port, a very simple and at the same time highly efficient amplifier architecture is provided. This means that the third port is somewhat silent, which means that no externally generated injection signal is required for this port. One benefit of this embodiment is to overcome the loss of the reflective termination, and even to replace it with an active gain, i.e. a reflection coefficient greater than or equal to 1. In particular, the reflection coefficient is variable, preferably between 0 and any user defined value. The high reflection coefficient enables a higher efficiency of operation especially while the reflection amplifier again requires only a comparably low reflection gain. A further benefit of this embodiment is that no prediction nor synthesis effort is needed for the calculation of an injection signal since the negative reflection amplifier uses an already existing signal that is coming out of the third port of the second hybrid coupler, and reflects it back to the same third port.

In a further aspect, the negative resistance amplifier comprises a control terminal for receiving a control signal. The negative resistance amplifier is configured such to set a predetermined magnitude of the reflection coefficient depending on the received control signal. This way, the reflection coefficient is programmable or settable depending on the actual or user defined needs.

According to a further aspect, the gain of the negative resistance amplifier is below 3-dB and in particular in the range of about 1-dB or below. A gain of the negative resistance amplifier of the order of about 1-dB is sufficient to overcome the loss of a matching network of the reflection amplifier. This is less expensive and more efficient than known solutions which need gains in the order of 20-db or more.

According to another embodiment, the negative resistance amplifier circuit comprises a RF reflection amplifier.

According to an additional or further embodiment, the negative resistance amplifier circuit comprises at least one IMPATT diode. An IMPATT diode (impact ionization avalanche transit-time diode) is a form of high-power semiconductor diode often used in high-frequency microwave electronics devices. They provide a negative resistance and can be used as amplifiers at microwave frequencies. In electronics, negative resistance denotes the property of some electrical circuits and devices in which an increase in voltage across the device's input and output terminals results in a decrease in electric current through it. IMPATT diodes operate at frequencies of about 3 GHz and 100 GHz, or higher. The main advantage is their high-power capability.

According to an additional or further embodiment, the negative resistance amplifier circuit comprises at least one circulator circuit that is connected to an output of a reflection amplifier or another circulator circuit. A circulator is a passive, non-reciprocal three- or four-port device that only allows a microwave or RF signal to exit through the port directly after the one it entered. Ports are where an external waveguide or transmission line, such as a coaxial cable, connects to the device. For a three-port circulator, an input signal applied to port 1 only comes out of port 2, an input signal applied to port 2 only comes out of port 3, and so on.

According to a further aspect, the RF amplifier circuit arrangement comprises a sharpening filter coupled between the negative resistance amplifier and the third port of the second quadrature hybrid coupler. This makes it possible that the critical isolated third port is terminated with a negative resistance amplifier or in particular a reflection amplifier and at the same time optional shaping filter structures are provided. These shaping filter structures may be designed much more simpler.

In a further configuration, the RF amplifier circuit arrangement further comprises one single RF input terminal for receiving the RF input signal. The RF amplifier circuit arrangement also comprises an RF output terminal connected to a fourth or output port of the second quadrature hybrid coupler for providing an RF output signal and for coupling the amplifier circuit arrangement to an external or internal load.

According to a further aspect, the amplifier circuit arrangement further comprises at least one matching network. Each matching network is coupled to a respective one of the four ports of the first or second quadrature hybrid couplers in order to perform impedance transformation. At least one of the matching networks comprises a transmission line or a lumped element.

According to a particular preferred configuration of the electronic device, the electronic device comprises at least on one of: a radio transmitter, a TV transmitter, a radio base station, a bargaining chip and/or a broadband amplifier.

Where appropriate, the above-mentioned configurations and developments can be combined in any manner. Further possible configurations, developments and implementations of the invention also include combinations, which are not explicitly mentioned, of features of the invention which have been described previously or are described in the following with reference to the embodiments. In particular, in this case, a person skilled in the art will also add individual aspects as improvements or supplements to the basic form of the present invention.

CONTENT OF THE DRAWINGS

The present invention is described in greater detail in the following on the basis of the embodiments shown in the schematic figures of the drawings, in which:

FIGS. 3A-3E shows some exemplary embodiments for an RF signal clipping circuit;

FIG. 9 is a schematic block diagram illustrating an amplifier circuit arrangement according to a further aspect;

Figure 1:
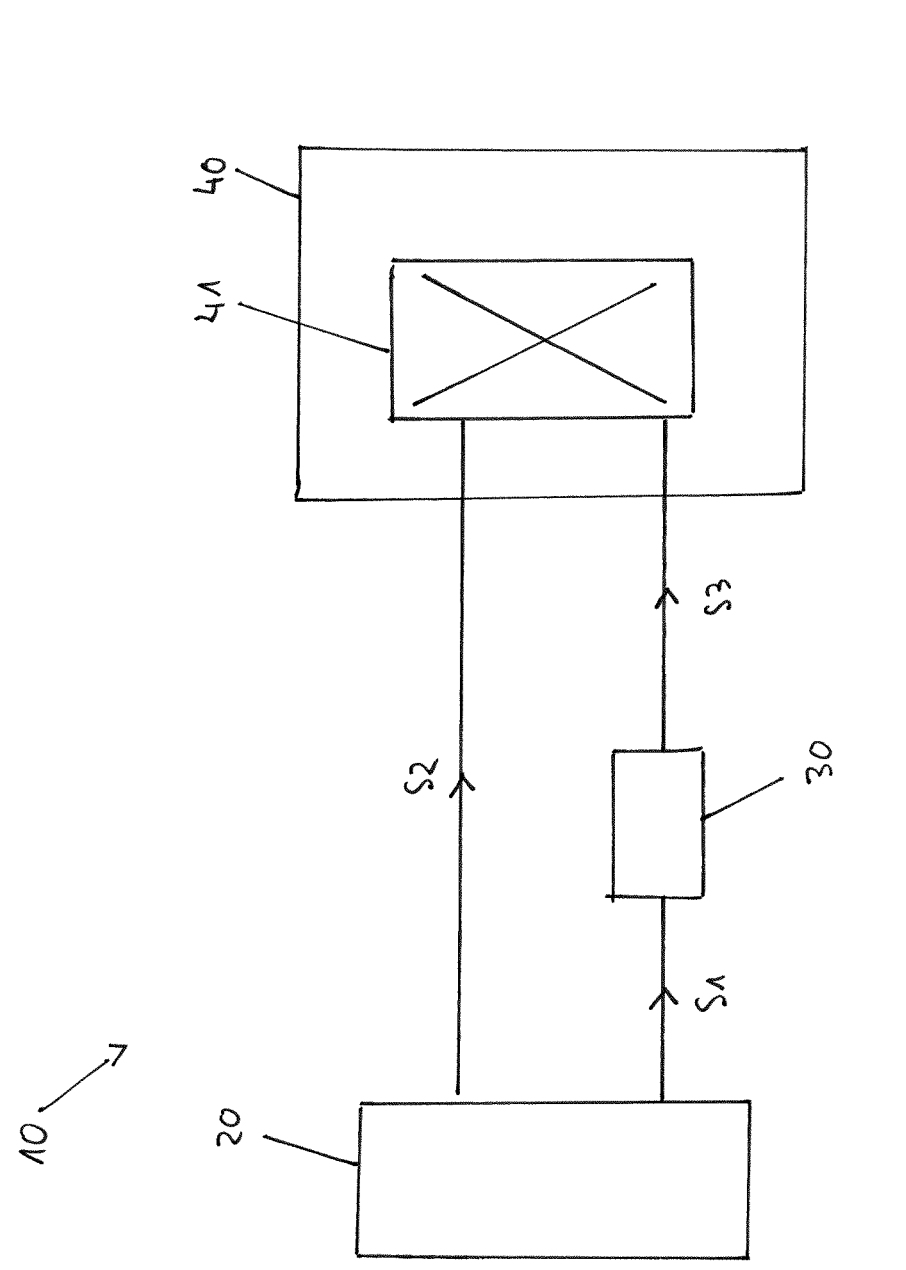
FIG. 1 is a schematic block diagram illustrating a RF amplifier circuit arrangement according to a first aspect.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated otherwise.

DESCRIPTION OF EMBODIMENTS

FIG. 1 shows a schematic block diagram illustrating a RF amplifier circuit arrangement according to a first aspect of the present invention.

In FIG. 1, the RF amplifier circuit arrangement is denoted by reference numeral 10. The amplifier circuit arrangement 10 is configured for amplifying a radio frequency (RF) input signal. The amplifier circuit arrangement 10 comprises an RF signal splitting circuit 20, an RF signal clipping circuit 30 and a load modulated balanced amplifier (LMBA) 40.

The splitting circuit 20 is preferably a symmetrical circuit that is configured to split the received RF input signal into two identical first and second RF input signals S1, S2. In FIG. 1, the RF signal splitting circuit 20 is a passive circuit comprising no active elements. The splitting circuit 20 maybe a symmetrical power divider, such as a 3-way Wilkinson splitter.

The RF signal clipping circuit 30 is connected downstream the splitting circuit 20. The RF signal clipping circuit 30 is configured to receive the first RF input signal S1 and to produce a clipped RF input signal S3 thereof depending on the predefined clipping level defined by the circuitry of the RF signal clipping circuit 30. The RF signal clipping circuit 30 may comprises a diode limiter circuit comprising at least one diode. Some exemplary embodiments for the RF signal clipping circuit 30 are yet described hereinafter with regard to FIG. 3A-3E.

The LMBA 40 is connected downstream the RF signal splitting circuit 20 and the RF signal clipping circuit 30. The LMBA 40 comprises a first hybrid coupler 41 at an input side of the LMBA 40. The first hybrid coupler 41 maybe a 3-dB quadrature hybrid coupler. The quadrature hybrid coupler 41 is the special case of a four-port directional coupler that is designed for a 3-dB (equal) power split and which provides a 90° shift on one of its output ports. The first hybrid coupler 41 is arranged and configured such to receive the clipped RF input signal S3 from the RF signal clipping circuit 30 and the splitted RF input signal S2 from the RF splitting circuit 20.

Figure 2:
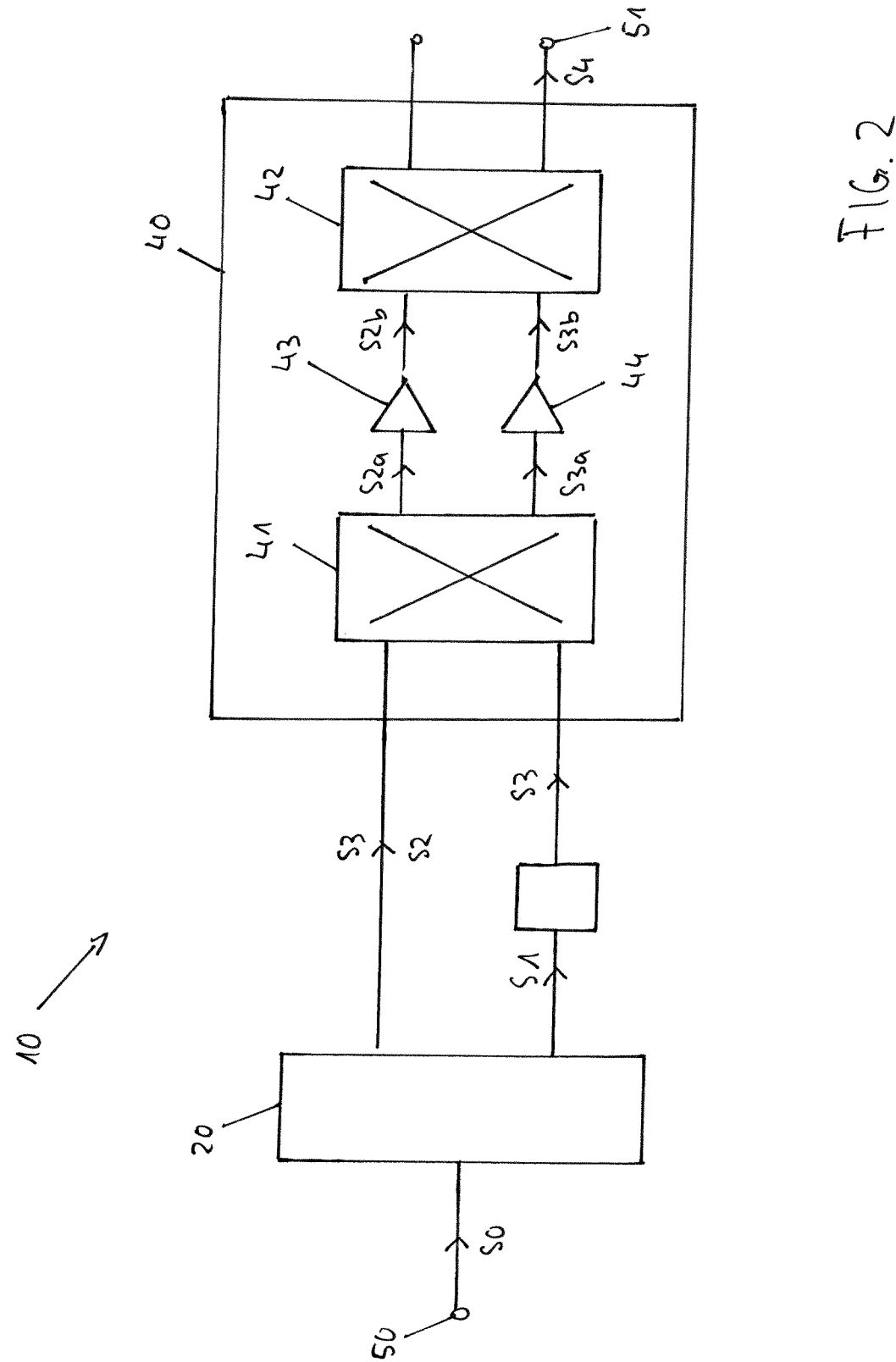
FIG. 2 is a schematic block diagram illustrating a RF amplifier circuit arrangement according to a second aspect.

FIG. 2 shows a schematic block diagram illustrating a RF amplifier circuit arrangement according to a second aspect of the present invention.

In FIG. 2, the RF amplifier circuit arrangement 10 further comprises one single RF input terminal 50 for receiving RF input signal S0.

Besides the first hybrid coupler 41 the LMBA 40 comprises a second hybrid coupler 42 and two amplifiers 43, 44 arranged between the first and second hybrid couplers 41, 42. The first and second hybrid couplers 41, 42 are preferably of the same type and circuitry and are preferably both 3-dB quadrature hybrid couplers 41, 42. While the first quadrature hybrid coupler 41 is arranged at an input side of the LMBA 40, the second quadrature hybrid coupler 42 is arranged at an output side of the LMBA 40. The two amplifiers 43, 44 amongst which one is the main amplifier (or carrier amplifier) and the other one is the auxiliary amplifier (or peaking amplifier) are arranged between the first and second quadrature hybrid couplers 41, 42.

In FIG. 2, the LMBA 40 is an orthogonal load modulated balanced amplifier (OLMBA). The orthogonal LMBA 40 comprises two input ports 45a, 45b and two output ports 45c, 45d.

In the example of FIG. 2, the two input ports 45a, 45b represent the input ports of the first quadrature hybrid couplers 41 and the two output ports 45c, 45d represent the output ports of the second quadrature hybrid couplers 42.

The first port 45a is directly connected to an output terminal of the splitting circuit 20 in order to provide the splitted RF input signal S2 to the first quadrature hybrid couplers 41. The second port 45b of the LMBA 40 is connected to the clipping circuit 30 in order to provide the splitted and clipped RF input signal S3 to the reverse input port of the first quadrature hybrid coupler 41.

The output port 45d of the LMBA 40 which represents the output terminal of the second quadrature hybrid coupler 42 is configured to provide the RF output signal S4 to an external load (not shown in FIG. 2). The other output port 45c is connected to a silent terminal of the second quadrature hybrid coupler 42.

The operational function of the RF amplifier circuit arrangement 10 shown in FIGS. 1 and 2 is hereinafter briefly described.

An input signal S0 provided at the input terminal 50 is symmetrically split in the splitting circuit 20 to provide two identical RF input signals S1, S2. These signals S1, S2 which at this point are more or less identical with regard to their amplitude and phase are forwarded towards the downstream arranged LMBA 40. However, one of the split RF input signals S2 is directly provided to the LMBA 40 whereas the other split RF input signal S1 is provided to a clipping circuit 30 before. Depending on the clipping level defined by the elements of the clipping circuit 30, the clipping circuit 30 passes the RF input signal S1 to output linearly up to the signal input reaches a predefined clipping level. Beyond that predefined clipping level the clipping circuit 30 clips the RF input signal S1.

As such, in case the splitted signal S1 is clipped, then the two RF input signals S1, S3 are different with regard to their amplitude.

The 3-dB quadrature hybrid coupler 41 within the LMBA 40 is performing an analog Fourier transformation which means that an amplitude difference between the two input signals S2, S3 is transformed into a phase difference at the output side.

The two resulting phase-shifted input signals S2a, S3a generated by the first hybrid coupler 41 are then provided to corresponding amplifiers 43, 44. These amplifiers 43, 44 are suitably amplifying these phase-shifted input signals S2a, S3a to generated the amplified phase-shifted input signals S2b, S3b. These amplified phase-shifted input signals S2b, S3b are then provided to a corresponding second hybrid coupler 42 which performs a second Fourier transformation which re-transforms the phase shift in the signals S2b, S3b towards an amplitude difference. This way, at the output 45d of the second hybrid coupler 42 and as such at the output port 51 of the RF amplifier arrangement 10 the amplified RF output signal S4 is provided.

FIGS. 3A-3E shows some exemplary embodiments for an RF signal clipping circuit:

In FIG. 3A, the RF signal clipping circuit 30 is composed of a single diode 31 which thus provides a clipping level of 0.7 Volt. The diode 31 maybe a conventional signal diode or a Zener diode.

In FIG. 3B, the RF signal clipping circuit 30 comprises a series connection of in this example four diodes 31a-31d in order to provide an overall clipping level of 2.8 Volt.

In FIG. 3C, the RF signal clipping circuit 30 comprises two diodes 31, 32 which are connected antiparallel to each other for providing corresponding clipping levels of 0.7 Volt as well for the positive and negative signal portion.

In FIG. 3D, the RF signal clipping circuit 30 comprises two antiparallel diodes 31, 32 that are biased by a predefined voltage 33, 34. This way, a predefined clipping level different to and in particular higher than of the clipping level of the diodes 31, 32 is possible.

In FIG. 3E, the RF signal clipping circuit 30 comprises two antiparallel diodes 31, 32 that are biased by an adjustable voltage 35, 36. This way, a predefined and adjustable clipping level is possible.

Figure 4:
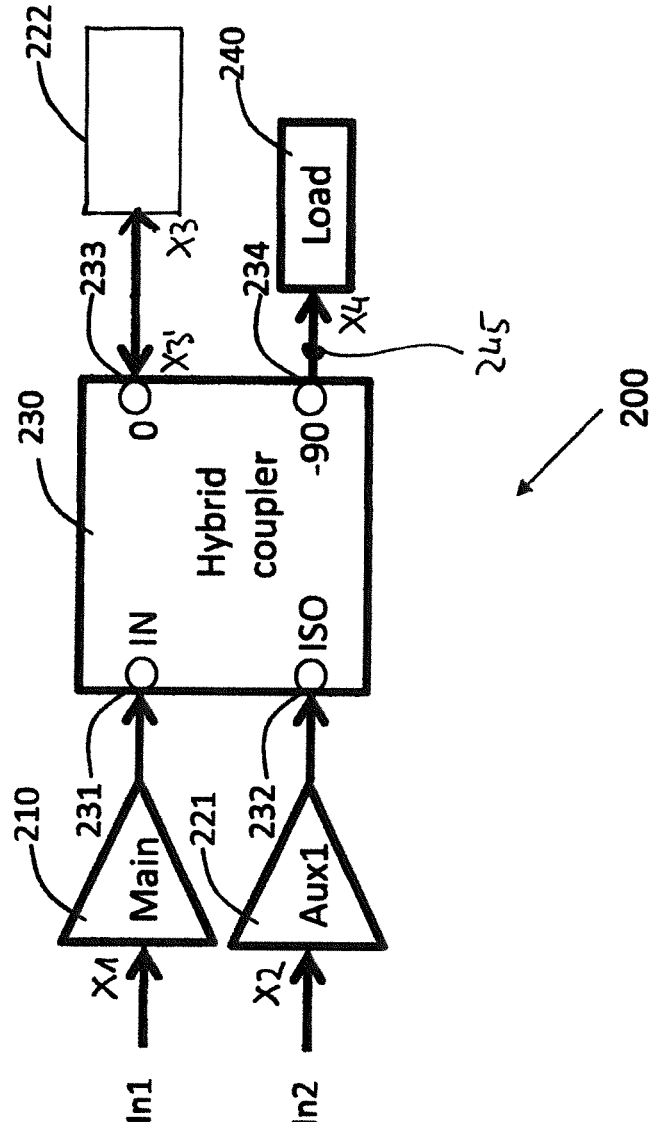
FIG. 4 is a schematic block diagram illustrating an amplifier circuit arrangement according to a third aspect.

FIG. 4 shows a schematic block diagram illustrating an amplifier circuit arrangement according to a third aspect.

In FIG. 4, the amplifier circuit arrangement is denoted by reference numeral 200. The amplifier circuit arrangement 200 shown in FIG. 4 may be of the same type and circuitry as the amplifier circuit arrangements 10 shown in FIGS. 1 and 2. The amplifier circuit arrangement 200 is configured for amplifying input signals, e.g. two separate input signals X1, X2, to one output signal X4 which is provided to a load 240.

The objective of the amplifier circuit arrangement 200 in FIG. 4 is to enhance its total efficiency for high PAR signals. The efficiency performance of the amplifier circuit arrangement 200 is at least equivalent to a conventional 3-way Doherty power amplifier or known amplifier circuit arrangement described in the introductory part.

The amplifier circuit arrangement 200 comprises a main amplifier circuit 210 having an input In1 for receiving one of the input signals X1 and an output. The amplifier circuit arrangement 200 further comprises an auxiliary amplifier circuit 221 having an input In2 for receiving another input signal X2 and an output.

The amplifier circuit arrangement 200 further comprises a negative resistance amplifier circuit 222 having a reflection coefficient greater than or equal to 1.

Each of the auxiliary amplifier circuit 221 and negative resistance amplifier circuit 222 is selectively operable to operate in combination with the main amplifier circuit 210.

The amplifier circuit arrangement 200 further comprises a single hybrid coupler 230. The hybrid coupler 230 comprises a first port 231 being coupled to the output of the main amplifier circuit 210, a second port 232 being coupled to the output of the auxiliary amplifier circuit 221, a third port 233 being coupled to the negative resistance amplifier circuit 222 and a fourth port 234 being coupled via output terminal 245 to a load 240.

In a preferred embodiment, the first port 231 is the primary input and the second port 232 is the CSP or reverse input of the hybrid coupler 230. The third port 233 is a silent port without any externally generated input signal. The fourth port 234 which forms the only output of the hybrid coupler 230 is connected to the output terminal 245.

The negative resistance amplifier 222 is configured to receive a signal X3 from the hybrid coupler 230 via the third port 233 and to return or reflect a suitably amplified signal X3' thereof back to the third port 233 of the hybrid coupler 230.

As illustrated in FIG. 4, the amplifier circuit arrangement 200 uses only one single hybrid coupler 230 instead of multiple couplers or coupling structures, to achieve 3-way Doherty power amplifier operation. The output power from the main amplifier circuit 220, auxiliary amplifier circuit 221 and negative resistance amplifier circuit 222 are individually injected into the first, second and third ports 231, 232, 233 of the hybrid coupler 230. The combined power is delivered to the load 240 via output terminal 245 in the form of an output signal X4 from the fourth port 234 of the hybrid coupler 230.

According to some preferable, but not necessary embodiments herein, the hybrid coupler 230 is a 3-dB quadrature hybrid coupler with four ports 231-234, which may correspond to the hybrid couplers 41, 42 shown in FIGS. 1 and 2. Any one of these four ports 231-234, i.e. input port IN, In-phase output port '0', isolation port ISO and quadrature output port '–90', can be selected arbitrarily as a first port 231. After the first port 231 is selected, the second, third and fourth ports 232-234 will be uniquely defined.

For example, in the case shown in FIG. 4, the input port IN is selected as the first port 231, which is coupled to the main amplifier circuit 210. Then the isolation port ISO which is isolated from the input port IN will be the second port 232 and is coupled to the output of the auxiliary amplifier circuit 221. The In-phase output port '0' which has a 0 degree transfer from the input port IN will be the third port 233 and is coupled to the output of the negative resistance amplifier circuit 222. And last but not least, the quadrature output port '–90' which has a –90 degree transfer from the input port IN will be the fourth port 234 and is coupled to the load 240.

For another example, if the In-phase output port '0' is selected as the first port 231, which is coupled to the main amplifier circuit 210. Then the quadrature output port '–90' will be the second port 232 and is coupled to the output of the auxiliary amplifier circuit 221. The input port IN will then be the third port 233 and is coupled to the output of the negative resistance amplifier circuit 222. And the isolation port ISO will be the fourth port 234 and is coupled to the load 240.

For a third example, if the quadrature output port '–90' is selected as the first port 231, which is coupled to the main amplifier circuit 210. Then the In-phase output port '0' will be the second port 232 and is coupled to the output of the auxiliary amplifier circuit 221. The isolation port ISO will be then the third port 233 and is coupled to the output of the negative resistance amplifier circuit 222. And the input port IN will be the fourth port 234 and is coupled to the load 240.

For a last example, if the isolation port ISO is selected as the first port 231, which is coupled to the main amplifier circuit 210. Then the input port IN will be the second port 232 and is coupled to the output of the auxiliary amplifier circuit 221. The quadrature output port '–90' will be the third port 233 and is coupled to the output of the negative resistance amplifier circuit 222. And the In-phase output port '0' will be the fourth port 234 and is coupled to the load 240.

According to some embodiments herein, the hybrid coupler 230 may be constructed as a Branch-line coupler, a lumped elements coupler, a coupled-line coupler or a Lange coupler. For example, a Branch-line coupler is made from 4 pieces of transmission lines. A coupled-line coupler is made from 2 pieces of mutually coupled transmission lines. A lumped element coupler is made from inductors and capacitors. Lange couplers are made from interleaved multiple sections of coupled transmission lines.

Hereinafter several exemplary embodiments of the circuit implementation of a negative resistance amplifier circuit are shown with regard to FIGS. 5A-5E.

Figure 5D:
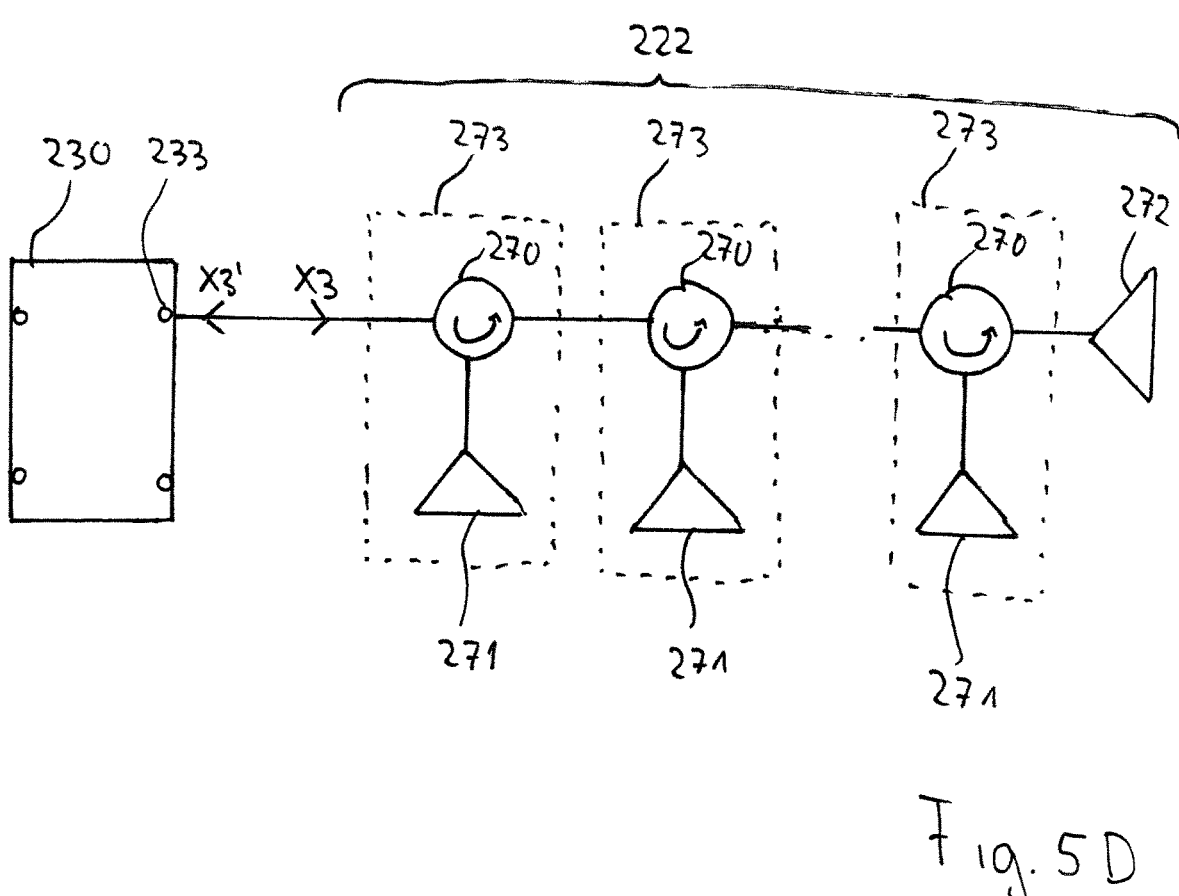
FIGS. 5A-5E show schematic circuitries illustrating some specific embodiments of a negative resistance amplifier circuit.
Figure 5E:
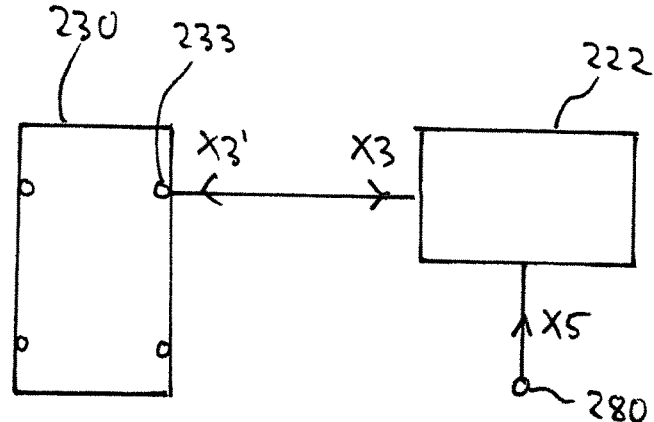
Figure 5A:
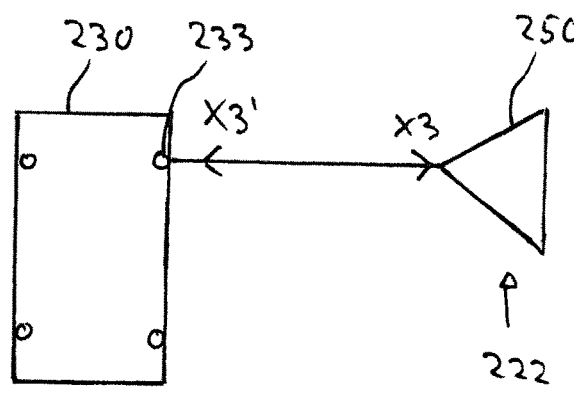

According to a first embodiment shown in FIG. 5A, the negative resistance amplifier circuit 222 is a reflection amplifier 250.

Figure 5B:
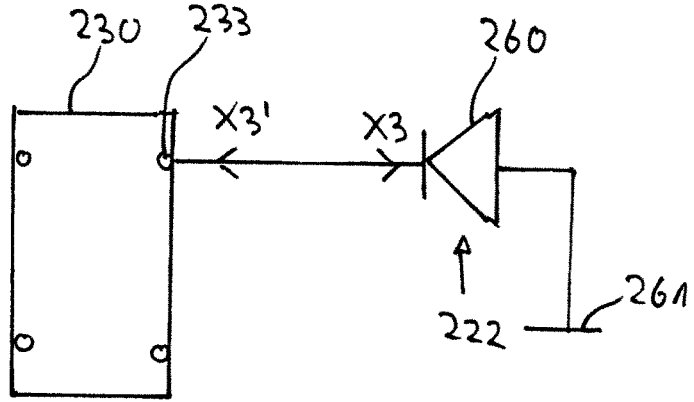

According to a second embodiment shown in FIG. 5B, the negative resistance amplifier circuit 222 is realized as a simple IMPATT diode 260. The IMPATT diode 260 is a passive, two-port electrical element where one of these ports is connected to the p-side and the other port is connected to the n-side of the IMPATT diode 260. The IMPATT diode 260 here forms a circuit termination against a reference potential 261, which in the example shown in FIG. 5B is the potential of reference ground 261.

Figure 5C:
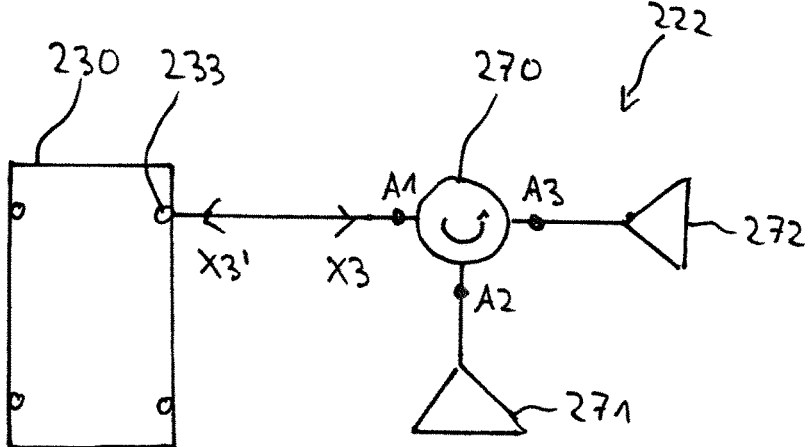

According to a third embodiment shown in FIG. 5C, the negative resistance amplifier circuit 222 comprises a three-port circulator 270 and two reflection amplifiers 271, 272. The input port A1 of the circulator 270 is connected to the third port 233 of the hybrid coupler 230 for receiving the signal X3. The circulator 270 further comprises two other ports A2, A3 which are each connected to respective reflection amplifier 271, 272. For a three-port circulator 270 shown in FIG. 5C, an input signal X3 applied to port A1 only comes out of port A2, an input signal applied to port A2 only comes out of port A3, and an input signal applied to port A3 only comes out of port A1. As such, at port A1 a suitably amplified reflection signal X3' which is derived from the input signal X3 is provided and applied to the third port 233 of the hybrid coupler 230.

Preferably, the reflection amplifiers 271, 272 can in designed as IMPATT diodes.

In another embodiment not shown in the drawing, the circulator 270 used for the resistance amplifier circuit 222 is a four-port circulator which comprises three reflection amplifiers. This embodiment would result in an even higher gain.

According to a fourth embodiment shown in FIG. 5D, the negative resistance amplifier circuit 222 comprises a plurality of three-port circulators 270 and reflection amplifiers 271, 272. A circulator 270 and one of the reflection amplifiers 271 which is connected to the second port of a circulator 270 form a reflection pair 273. Adjacently arranged circulators 270 are coupled together via their first and third ports A1, A3, respectively. The reflection amplifiers 272 forms the circuit termination. The plurality of reflection pairs 273 are connected in series in a Daisy chain configuration.

According to a fifth embodiment shown in FIG. 5E, the negative resistance amplifier circuit 222 comprises a control terminal 280 for receiving a control signal X5. In this preferred embodiment, the negative resistance amplifier circuit 222 is programmable so that its gain is adjustable or settable depending on the received control signal.

Figure 6:
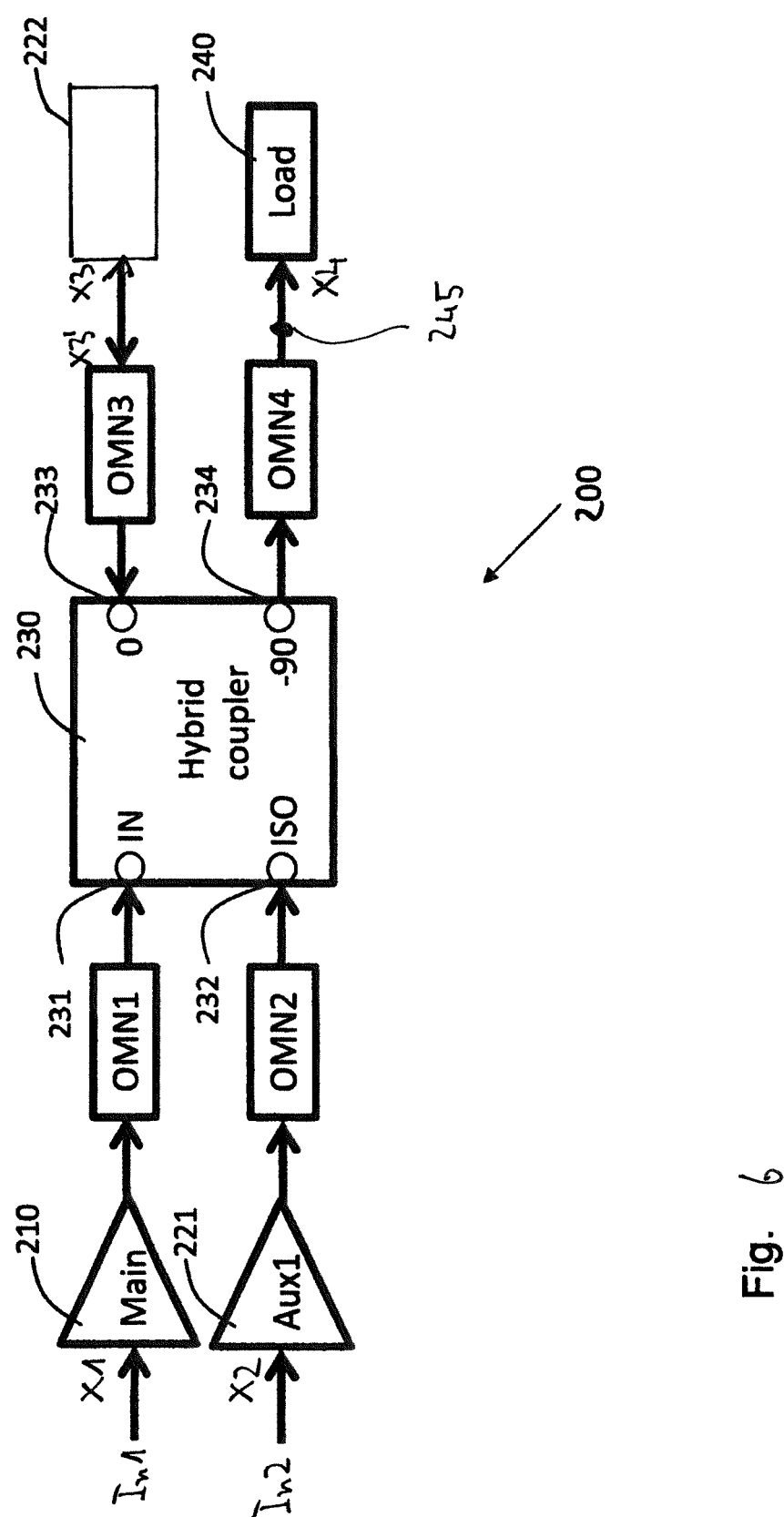
FIG. 6 is a schematic block diagram illustrating an amplifier circuit arrangement according to a further aspect.

FIG. 6 shows a schematic block diagram illustrating an amplifier circuit arrangement according to a further aspect.

The amplifier circuit arrangement 200 may comprise in this embodiment one or more output matching networks OMN1, OMN2, OMN3, OMN4. Each output matching network OMN1, OMN2, OMN3, OMN4 is coupled to a respective one of the four ports 231-234 of the hybrid coupler 230 to perform impedance transformation.

Preferably, a characteristic impedance of the hybrid coupler 230 is configured to match a loading impedance of the load 240.

Preferably, but not necessarily, at least one of the output matching networks OMN1, OMN2, OMN3, OMN4 may comprise transmission lines, such as strip lines, micro-strip lines and coplanar waveguide, or lumped elements, such as capacitors and inductors.

To explain the functionality of the amplifier circuit arrangement 200, a particular embodiment, where the hybrid coupler 230 is a conventional 3-dB quadrature hybrid coupler 230 is discussed in the following.

Figure 7:
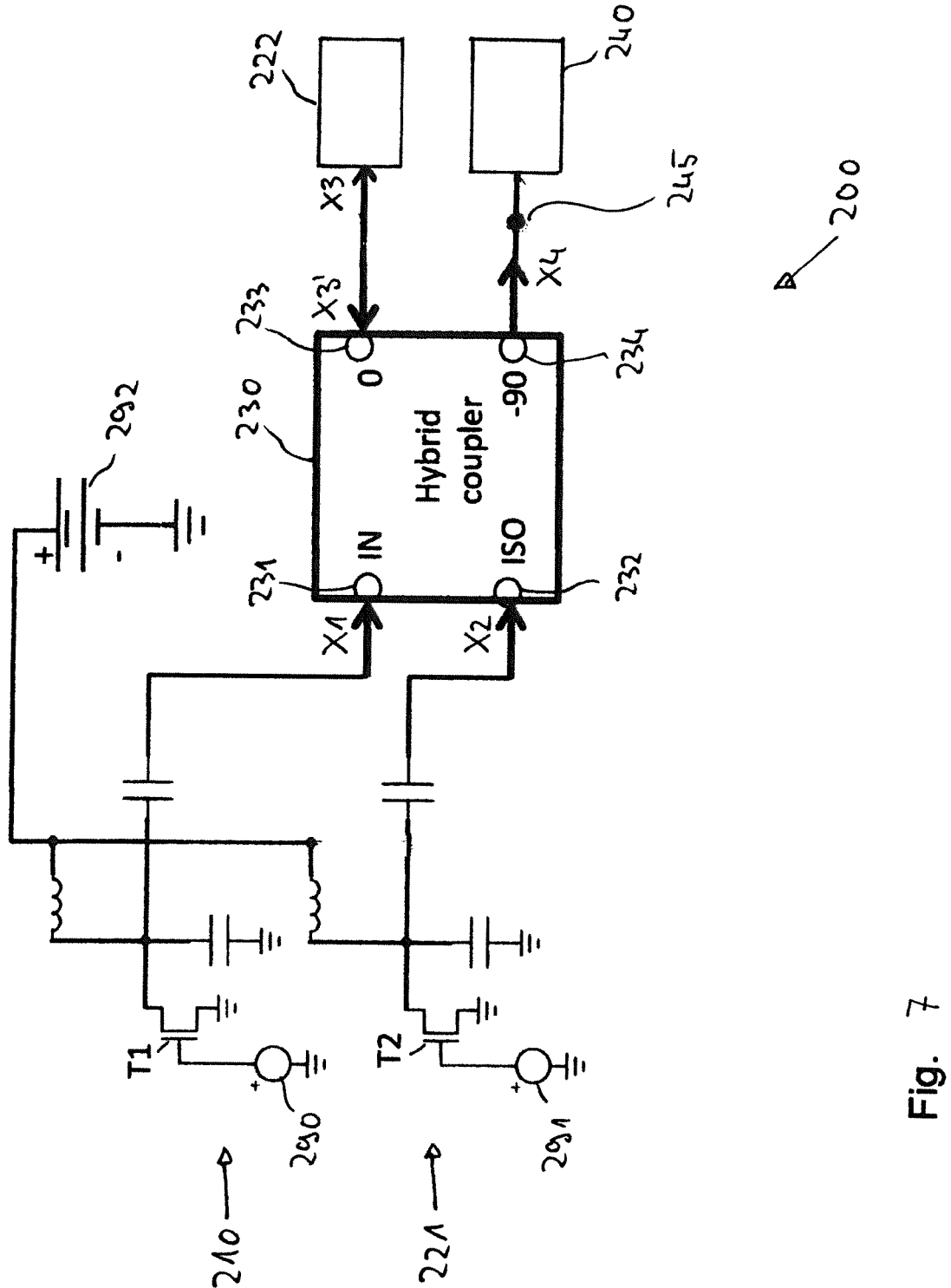
FIG. 7 is a schematic block diagram illustrating a more detailed amplifier circuit arrangement according to a further aspect.

FIG. 7 shows a schematic block diagram illustrating a more detailed amplifier circuit arrangement according to a further aspect.

The main amplifier circuit 210 and the auxiliary amplifier circuits 221 may be implemented by transistors T1, T2, respectively. Transistors T1, T2 may be any of a high electron mobility transistor (HEMT), a heterojunction bipolar transistor (HBT) or a laterally-diffused metal-oxide semiconductor (LDMOS) transistor. These transistors may be made of a suitable semiconductor material, such as Gallium nitride (GaN), Silicon (Si), Gallium arsenide (GaAs), Silicon carbide (SiC), Indium phosphide (InP) or the like.

The transistors T1, T2 are switched by a suitable control signal which is applied to respective control terminals of transistors T1, T2 using a control circuit 290, 291.

The load path of transistor T1 is connected between reference ground and the first port 231. Similarly, the load path of transistor T2 is connected between reference ground and the second port 232. A charging circuit comprising two capacitors and an inductor coupled to a voltage supply 292 is arranged between the respective output terminals of the two transistors T1, T2 and the respective first and second ports 231, 232.

Figure 8:
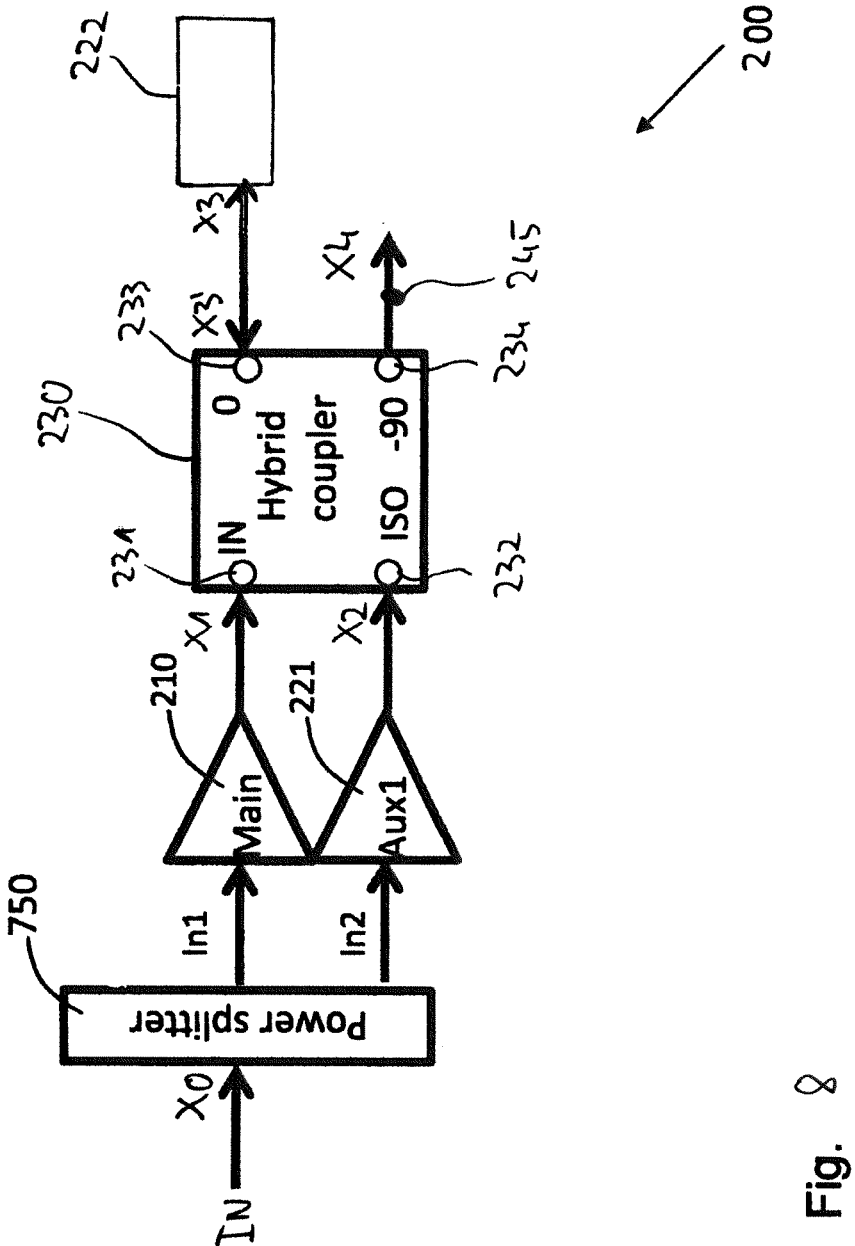
FIG. 8 is a schematic block diagram illustrating an amplifier circuit arrangement according to a further aspect.
Figure 8:
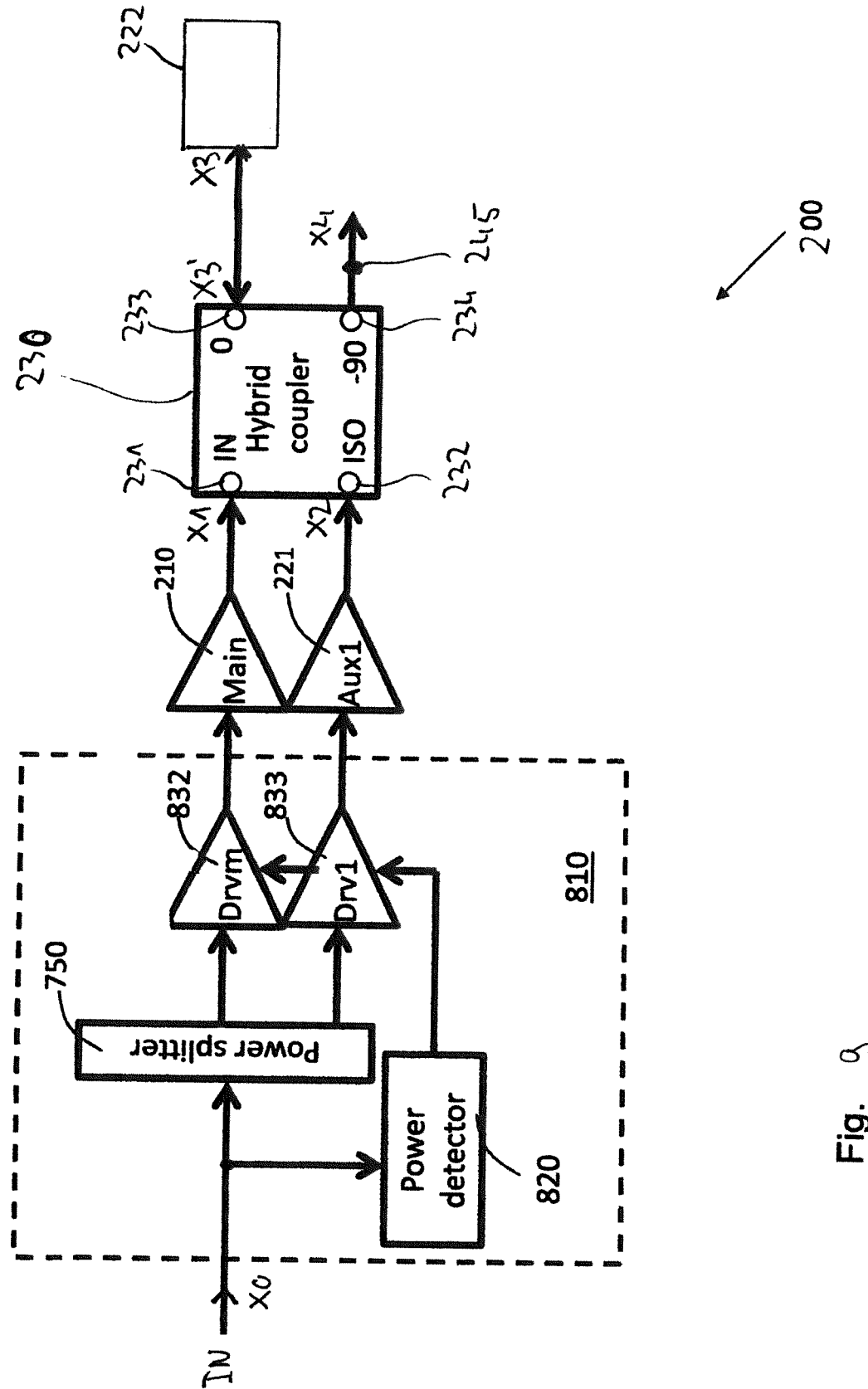

FIG. 8 shows a schematic block diagram illustrating an amplifier circuit arrangement according to a further aspect.

The amplifier circuit arrangement 200 in this example is a single-input-single-output amplifier. The amplifier circuit arrangement 200 comprises a power splitter 750. The power splitter 750 is configured to split the input signal X0 at an input terminal IN into two split input signals X1, X2 and to feed each split input signal X1, X2 to the respective input In1, In2 of the main and auxiliary amplifier circuits 210, 221.

Preferably, but not necessarily, the power splitter 750 is an uneven 3-way Wilkinson splitter 750.

FIG. 9 shows a schematic block diagram illustrating an amplifier circuit arrangement according to a further aspect.

The amplifier circuit arrangement 200 comprises in this example a power detector 820. The power detector 820 is configured to sense the power of the RF input signal X0. The power detector 820 is further configured to control the power of the driving signals to the main and second auxiliary amplifier circuits 210, 221. For example, the amplifier circuit arrangement 200 may comprise drive amplifiers 832 and 833, each being configured to receive a splitted RF input signal and to amplify the splitter input signal to a drive signal with a certain gain, and to provide or to apply the drive signals to the main and second auxiliary amplifier circuits 210, 221, respectively. The output signal from the power detector 820 then may control the gain of the drive amplifiers 832 and 833.

In this respect, the power detector 820, the power splitter 750 and the variable-gain amplifiers 832 and 833 may be defined as a signal processing component 810. They may be implemented as, for example, analog hardware, digital firmware or software algorithms. Therefore according to some embodiments herein, the amplifier circuit arrangement 200 may comprise a signal processing component 810 configured to control power of the drive signals and selectively apply the drive signals with a specific gain with respect to the input signal to the main amplifier circuit 210 and the auxiliary amplifier circuit 221 such that the drive signal to the main amplifier circuit 210 has a higher gain for higher level input signals than a gain for lower level input signals, and each of the auxiliary amplifier circuits 221 and negative resistance amplifier circuit 222 is selectively operable to operate in combination with the main amplifier circuit 210.

The amplifier circuit arrangement 200 according to embodiments herein may be employed in various integrated circuits, e.g. monolithic integrated circuits, electronic devices or communication devices, e.g. radio transmitters, radio base stations, mobile stations.

Figure 10:
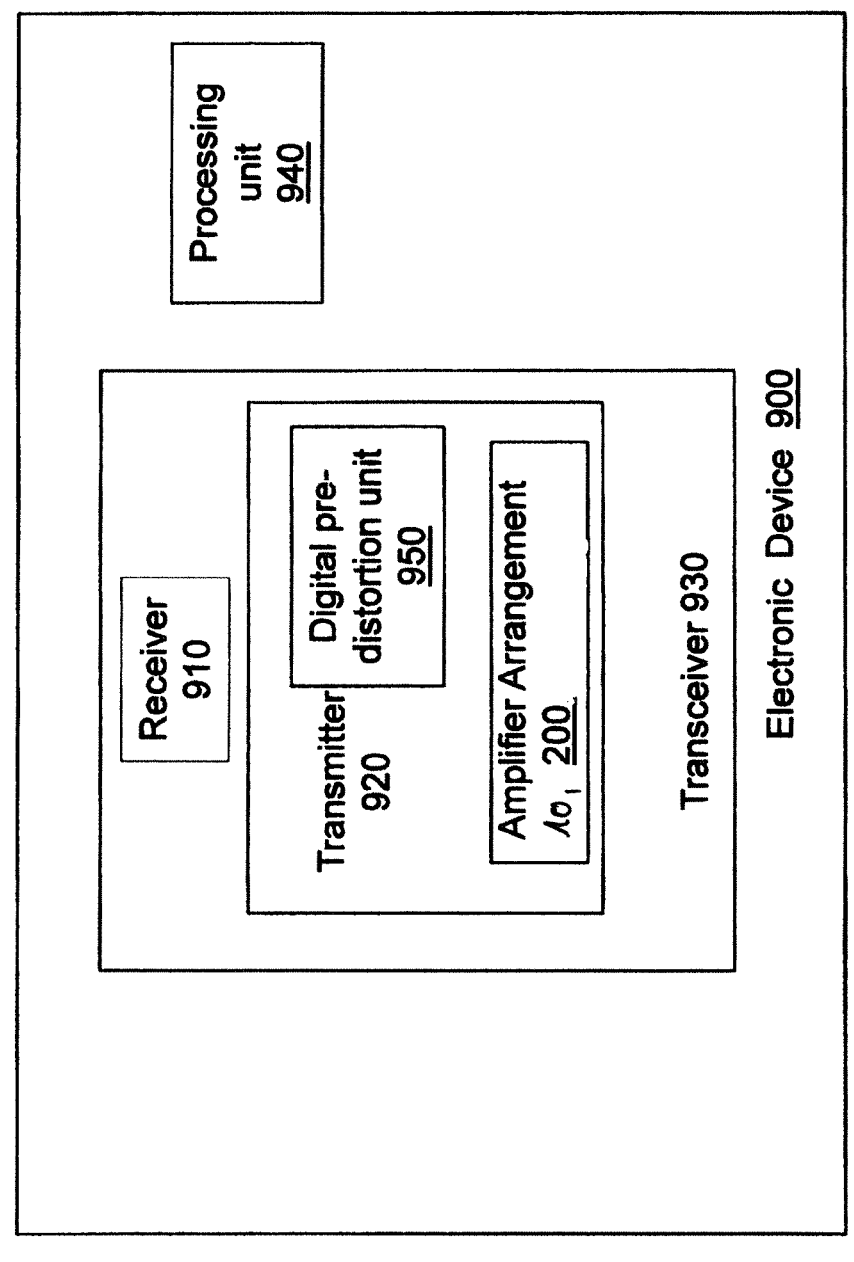
FIG. 10 is a schematic block diagram illustrating an electronic device in which an amplifier circuit arrangement is implemented.

FIG. 10 shows a schematic block diagram illustrating an electronic device according to a further aspect, which may be, e.g. an integrated circuit, a mobile station or a radio base station.

The electronic device 900 comprises a transceiver 930 and a processing unit 940. The transceiver comprises a receiver 910 and a transmitter 920.

In practice, the proposed amplifier circuit arrangement 200 may have insufficient linearity for certain applications. In these cases, the system linearity can often be enhanced by digital pre-distortion. Accordingly, the transmitter 920 may further comprise a digital pre-distortion unit 950 connected to the amplifier circuit arrangement 10, 200 as described before with regard to FIGS. 1-9.

To conclude, the amplifier circuit arrangements 200 according to embodiments herein have several advantages. The proposed solution employs only a single hybrid coupler 230 which is a single coupling structure to combine power properly from different amplifier circuits.

In printed-circuit board (PCB) implementations, the hybrid coupler may be a 3-dB quadrature type combiner. They are common, commercially available, physically small on high permittivity materials and cheap for manufacturing as surface-mount devices. Accordingly, the amplifier circuit arrangements 10, 200 according to the embodiments herein may be more compact, less complicated and less expensive. More significantly, in multi media IC implementations, chip-area reducing and cost saving may be 50% more than those 3-way DPAs in prior arts.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections between various elements as shown and described with respect to the drawings may be a type of connection suitable to transfer signals from or to the respective nodes, units or devices, for example via intermediate devices. Accordingly, unless implied or stated otherwise the connections may for example be direct connections or indirect connections.

Because the apparatuses implementing the present invention are, for the most part, composed of electronic components and circuits known to those skilled in the art, details of the circuitry and its components will not be explained in any greater extent than that considered necessary as illustrated above, for the understanding and appreciation of the underlying concepts of the present invention and in order not to obfuscate or distract from the teachings of the present invention.

Also, the invention is not limited to physical devices or units implemented in non-programmable hardware, but can also be applied in programmable devices or units able to perform the desired device functions by operating in accordance with suitable program code. Furthermore, the devices may be physically distributed over a number of apparatuses, while functionally operating as a single device. Devices functionally forming separate devices may be integrated in a single physical device. Those skilled in the art will recognize that the boundaries between logic or functional blocks are merely illustrative and that alternative embodiments may merge logic or functional blocks or impose an alternate decomposition of functionality upon various logic or functional blocks.

In the description, any reference signs shall not be construed as limiting the claim. The word "comprising" does not exclude the presence of other elements or steps then those listed in a claim. Furthermore, the terms "a" or "an", as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage. The order of method steps as presented in a claim does not prejudice the order in which the steps may actually be carried out, unless specifically recited in the claim.

Skilled artisans will appreciate that the illustrations of chosen elements in the drawings are only used to help to improve the understanding of the functionality and the arrangements of these elements in various embodiments of the present invention. Also, common and well understood elements that are useful or necessary in a commercially feasible embodiment are generally not depicted in the drawings in order to facilitate the understanding of the technical concept of these various embodiments of the present invention. It will further be appreciated that certain procedural stages in the described methods may be described or depicted in a particular order of occurrence while those skilled in the art will understand that such specificity with respect to sequence is not actually required.

LIST OF USED REFERENCE SYMBOLS

10 RF amplifier circuit arrangement
20 RF signal splitting circuit
30 RF signal clipping circuit
31, 32 diodes
31a-31d diodes
33, 34 predefined voltages
35, 36 adjustable voltages
40 load modulated balanced amplifier, LMBA
41 first (quadrature) hybrid coupler
42 second (quadrature) hybrid coupler
43 (main) amplifier
44 (auxiliary) amplifier
45a, 45b input ports of the first (quadrature) hybrid coupler
45c, 45d output ports of the second (quadrature) hybrid coupler
50 RF input terminal
51 RF output terminal
200 amplifier circuit arrangement
210 main amplifier circuit
221 auxiliary amplifier circuit
222 negative resistance amplifier circuit
230 hybrid coupler
231 first, main port of hybrid coupler
232 second, CSP port of hybrid coupler
233 third, silent port of hybrid coupler
234 fourth, output port of hybrid coupler
240 load
245 output terminal
250 reflection amplifier
260 IMPATT diode
261 reference potential
270 three-port circulator
271, 272 reflection amplifiers
273 reflection pair
280 control terminal
290, 291 control circuits
292 voltage supply
750 power splitter
810 signal processing components
820 power detector
832, 833 drive amplifiers, variable-gain amplifiers
900 electronic device
930 transceiver
910 receiver
920 transmitter
940 processing unit
950 digital pre-distortion unit
A1-A3 ports of circulator
IN input
In1, In2 inputs
OMN1, OMN2, OMN3, OMN4 output matching networks T1, T2 transistors
X0 input signal
X1, X2 input signals
X3 signal
X3' amplified, reflected signal
X4 output signal
X5 control signal
S0 RF input signals
S1, S2 splitted RF input signals
S3 clipped RF input signal
S2a, S3a phase-shifted input signals
S2b, S3b amplified phase-shifted input signals
S4 RF output signal

I claim:

1. A RF amplifier circuit arrangement for amplifying at least one radio frequency (RF) input signal, the RF amplifier circuit arrangement comprising:
   an RF signal splitting circuit configured to split a RF input signal into a first RF input signal and a second RF input signal;
   an RF signal clipping circuit configured and arranged such to receive the first RF input signal and to produce a clipped RF input signal thereof;
   a load modulated balanced amplifier (LMBA) coupled to the RF signal splitting circuit and the RF signal clipping circuit, the LMBA comprising a first quadrature hybrid coupler at an input side of the LMBA wherein the first quadrature hybrid coupler is arranged such to receive the clipped RF input signal and the second RF input signal.

2. The RF amplifier circuit arrangement of claim 1, wherein the RF signal splitting circuit is a passive RF signal splitting circuit configured to split the RF input signal into two identical first and second RF input signals.

3. The RF amplifier circuit arrangement of claim 1, wherein the RF signal splitting circuit is a symmetrical power divider.

4. The RF amplifier circuit arrangement of claim 1, wherein the RF signal splitting circuit comprises a symmetrical Wilkinson power divider and in particular a 3-way Wilkinson splitter.

5. The RF amplifier circuit arrangement of claim 1, wherein the RF signal clipping circuit comprises a diode limiter circuit comprising at least one diode.

6. The RF amplifier circuit arrangement of claim 5, wherein the diode limiter circuit comprises at least two diodes which are connected antiparallel to each other.

7. The RF amplifier circuit arrangement of claim 1, wherein the RF signal clipping circuit is configured such to set a predefined clipping level.

8. The RF amplifier circuit arrangement of claim 1, wherein the LMBA is an orthogonal load modulated balanced amplifier (OLMBA).

9. The RF amplifier circuit arrangement of claim 1, wherein the first quadrature hybrid coupler comprises a first input port and a reverse input port and wherein the first quadrature hybrid coupler is arranged such to receive the clipped RF input signal at its reverse input port.

10. The RF amplifier circuit arrangement of claim 1, wherein the LMBA further comprises a second quadrature hybrid coupler at an output side of the LMBA and wherein the LMBA further comprises a main amplifier and an auxiliary amplifier that are arranged between the first and second quadrature hybrid coupler.

11. The RF amplifier circuit arrangement of claim 1, wherein the LMBA further comprises a negative resistance amplifier circuit being coupled to a third port of the second quadrature hybrid coupler and having a reflection coefficient greater than or equal to 1.

12. The RF amplifier circuit arrangement of claim 11, wherein at least one of the auxiliary amplifiers of the LMBA and the negative resistance amplifier circuit being selectively operable to operate in combination with the main amplifier of the LMBA.

13. The RF amplifier circuit arrangement of claim 11, wherein the negative resistance amplifier comprises a control terminal for receiving a control signal and wherein the negative resistance amplifier is configured such to set a predetermined magnitude of the reflection coefficient depending on the received control signal.

14. The RF amplifier circuit arrangement of claim 11, wherein the gain of the negative resistance amplifier is below 3 dB and in particular in the range of 1 dB or below.

15. The RF amplifier circuit arrangement of claim 1, wherein the negative resistance amplifier circuit comprises at least one of:
   at least one RF reflection amplifier;
   at least one IMPATT diode;
   at least one circulators.

16. The RF amplifier circuit arrangement of claim 1, further comprising a sharpening filter coupled between the negative resistance amplifier and the third port of the second quadrature hybrid coupler.

17. The RF amplifier circuit arrangement of claim 1, further comprising one single RF input terminal for receiving the RF input signal and an RF output terminal connected to a fourth port of the second quadrature hybrid coupler for providing an RF output signal and for coupling the amplifier circuit arrangement to a load.

18. The amplifier circuit arrangement of claim 1, further comprising at least one matching network, wherein each matching network is coupled to a respective one of the four ports of the first or second quadrature hybrid couplers in order to perform impedance transformation, wherein at least one of the matching networks comprises a transmission line or a lumped element.

19. An electronic device comprising a RF amplifier circuit arrangement for amplifying at least one radio frequency (RF) input signal, the RF amplifier circuit arrangement comprising:
   an RF signal splitting circuit configured to split a RF input signal into a first RF input signal and a second RF input signal;
   an RF signal clipping circuit configured and arranged such to receive the first RF input signal and to produce a clipped RF input signal thereof;
   a LMBA coupled to the signal splitting device and the amplitude limiting device, the LMBA comprising a first quadrature hybrid coupler at an input side of the LMBA wherein the first quadrature hybrid coupler is arranged such to receive directly the clipped input signal and the second input signal.

20. The electronic device of claim 19, wherein the electronic device comprises at least on one of:
   a radio transmitter,
   a TV transmitter,
   a radio base station,
   a bargaining chip.

* * * * *